(12) United States Patent
Goodwin et al.

(10) Patent No.: US 6,612,851 B1
(45) Date of Patent: Sep. 2, 2003

(54) ELECTRICAL CONNECTOR ASSEMBLY FOR PRINTED CIRCUIT BOARDS

(75) Inventors: Jonathan W. Goodwin, Braintree, MA (US); Donald Amaral, Seekonk, MA (US); Wayne S. Alden, III, Whitman, MA (US); William Petrocelli, Douglas, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/118,731

(22) Filed: Apr. 9, 2002

(51) Int. Cl.[7] .............................................. H01R 12/00
(52) U.S. Cl. ......................................... 439/66; 439/67
(58) Field of Search .............................. 439/66, 67, 65

(56) References Cited

U.S. PATENT DOCUMENTS

| | | | | |
|---|---|---|---|---|
| 4,583,800 A | * | 4/1986 | Roberts et al. | 439/64 |
| 4,850,883 A | * | 7/1989 | Kabadi | 439/67 |
| 4,948,374 A | * | 8/1990 | Carter | 439/67 |
| 5,295,838 A | * | 3/1994 | Walen et al. | 439/67 |
| 5,402,316 A | * | 3/1995 | Volz et al. | 361/785 |
| 5,704,793 A | * | 1/1998 | Stokoe et al. | 439/62 |
| 5,871,362 A | * | 2/1999 | Campbell et al. | 439/67 |
| 6,077,090 A | * | 6/2000 | Campbell et al. | 439/67 |
| 6,162,065 A | * | 12/2000 | Benham | 439/67 |
| 6,299,460 B1 | * | 10/2001 | Haselby et al. | 439/67 |
| 6,302,705 B1 | * | 10/2001 | Yatskov et al. | 439/67 |
| 6,537,082 B2 | * | 3/2003 | Hopfer et al. | 439/67 |

* cited by examiner

Primary Examiner—Tulsidas Patel

(57) ABSTRACT

An electrical connector assembly is provided including first and second circuit boards proximate each other and each having a first side and a second side. The electrical connector assembly includes flex circuits electrically connected to the first and second sides of the first and second circuit boards and carrying electrical signals therebetween. The electrical connector assembly includes load cells having at least one bowed spring, a base plate, and a cover plate. The spring has a peak portion and end portions and is compressed between the base and cover plates. The peak portion engages one of the base and cover plates with the end portions engaging another of the base and cover plates to exert a load force on the base and cover plates. The load cells are aligned opposite each other on the first and second circuit boards and retain the flex circuits thereto.

25 Claims, 9 Drawing Sheets

ELECTRICAL CONNECTOR ASSEMBLY FOR PRINTED CIRCUIT BOARDS

BACKGROUND OF THE INVENTION

Certain embodiments of the present invention generally relate to connector assemblies that electrically connect electronic components. More particularly, certain embodiments of the present invention generally relate to a high-speed, high-volume connector assembly that electrically connects printed circuit boards.

Because conventional printed circuit boards are manufactured to have limited sizes, some electronic applications require printed circuit boards to be laterally aligned across a desired distance and electrically connected by a connector assembly. The connector assembly transfers electric signals and power between the printed circuit boards.

The typical connector assembly for laterally adjacent printed circuit boards includes socket connectors that are attached to electrical contacts on top surfaces of the printed circuit boards proximate the adjacent edges thereof. The socket connectors have conductive contacts that are soldered to the electrical contacts on the printed circuit boards. The connector assembly also includes a flex circuit having two connected wafers. The wafers have conductive layers and conductive contacts. Each conductive contact on one wafer is connected to a corresponding conductive contact on the other wafer by a trace extending through one of the conductive layers. Each wafer is positioned on a socket connector such that the conductive contacts of the wafer are aligned with corresponding conductive contacts on the socket connectors, thus creating an electrical path between the printed circuit boards. The flex circuit is fastened onto the socket connectors and printed circuit boards by screws that extend therethrough into bolster plates located on opposite sides of the printed circuit boards. The screws apply a load force against the flex circuit and the socket connectors such that the flex circuit, socket connectors, and printed circuit boards are maintained in electrical contact.

Often the typical connector assembly includes a plurality of flex circuits that successively overlap each other along the top surfaces of the printed circuit boards such that each flex circuit extends a different distance laterally along, and vertically above, the printed circuit boards than the other flex circuits.

The typical connector assembly suffers from a number of drawbacks. First, if a thin bolster plate is used with the screws, the screws do not apply enough load force to effectively engage all of the conductive contacts of the flex circuit with the conductive contacts of the socket connectors. Additionally, the screws do not apply enough load force to connect a flex circuit having more than a few conductive layers, so a limited number of traces are available to connect the conducting contacts of the flex circuit. Thus the connector assembly processes a limited number of electrical signals at a slow speed. The screws may be fastened to a larger bolster plate in order to apply a large enough load force to electrically connect a greater number of the conductive contacts of the flex circuit and the socket connectors and effectively retain a flex circuit having additional conductive layers, however, the larger bolster plate further increases the profile of the connector assembly and limits the versatility of the printed circuit boards in electronic applications.

Secondly, because the load forces are mainly applied at the fixed location of each screw, the load force is unevenly distributed across the flex circuit. Many conductive contacts on the flex circuit therefore do not engage corresponding conductive contacts on the socket connector regardless of the size of the bolster plate. The uneven distribution of the load force leads to a limited volume and frequency of the electrical signals traveling through the connector assembly.

Finally, the use of a plurality of flex circuits to increase the volume and frequency of the electrical signals requires thicker bolster plates to absorb the load force of additional screws. Also, the varying lateral and vertical lengths of the different flex circuits result in a different inductance experienced by the electrical signals that pass through each flex circuit. Thus, the electrical signals are conducted through different flex circuits at different speeds and pass through the connector assembly at different times. This differentiation in frequency results in an inconsistent distribution of power and data along the printed circuit boards that limits the operation speed of the electronic application.

Therefore, a need exists for a connector assembly that overcomes the above problems and addresses other concerns experienced in the prior art.

BRIEF SUMMARY OF THE INVENTION

Certain embodiments of the present invention provide for an electrical connector assembly that includes first and second circuit boards configured to be positioned proximate each other and having electrical contacts on top and bottom sides thereof. The electrical connector assembly also includes socket connectors having conductive contacts positioned upon the top and bottom sides of the circuit boards such that the conductive contacts and the electrical contacts are electrically connected with one another. The electrical connector assembly also includes first and second flex circuits having conductive contacts. The first flex circuit interconnects the electrical contacts on the top sides of the first and second circuit board. The second flex circuit interconnects electrical contacts on the bottom sides of the first and second circuit boards such that the first and second flex circuits are located opposite each other. The electrical connector assembly also includes at least one load cell configured to exert a load force against at least one of the first and second flex circuits to compress the first and second flex circuits and the socket connectors against the first and second circuit boards.

Certain embodiments of the present inventions provide for an electrical connector assembly including first and second circuit boards proximate each other, each of first and second circuit boards having a first side and a second side. The electrical connector assembly includes a flex circuit electrically connected to the first sides of the first and second circuit boards that carries electrical signals therebetween. The electrical connector also includes load cells having at least one bowed spring, a base plate, and a cover plate. The spring has a peak portion and end portions and is compressed between the base and cover plates. The peak portion engages one of the base and cover plates and the end portions engage another of the base and cover plates to exert a load force on the base and cover plates. The load cells are located on the first and second circuit boards opposite each other on the first and second sides.

Certain embodiments of the present invention provide for a load cell including a base adapted to be mounted to a flex circuit having a notched recess located in a contact face of the base. The load cell includes a cover received in the notched recess to define a spring retention chamber extending along a lateral axis arranged parallel to the contact face. The load cell also includes a flex beam located in the spring retention chamber. The flex beam is bowed with opposed end portions engaging one of the base and cover and includes an intermediate portion between the opposed end portions that engages another of the base and cover. The flex beam is compressed between the base and cover to exert a load force on the base and cover.

Figure 1:
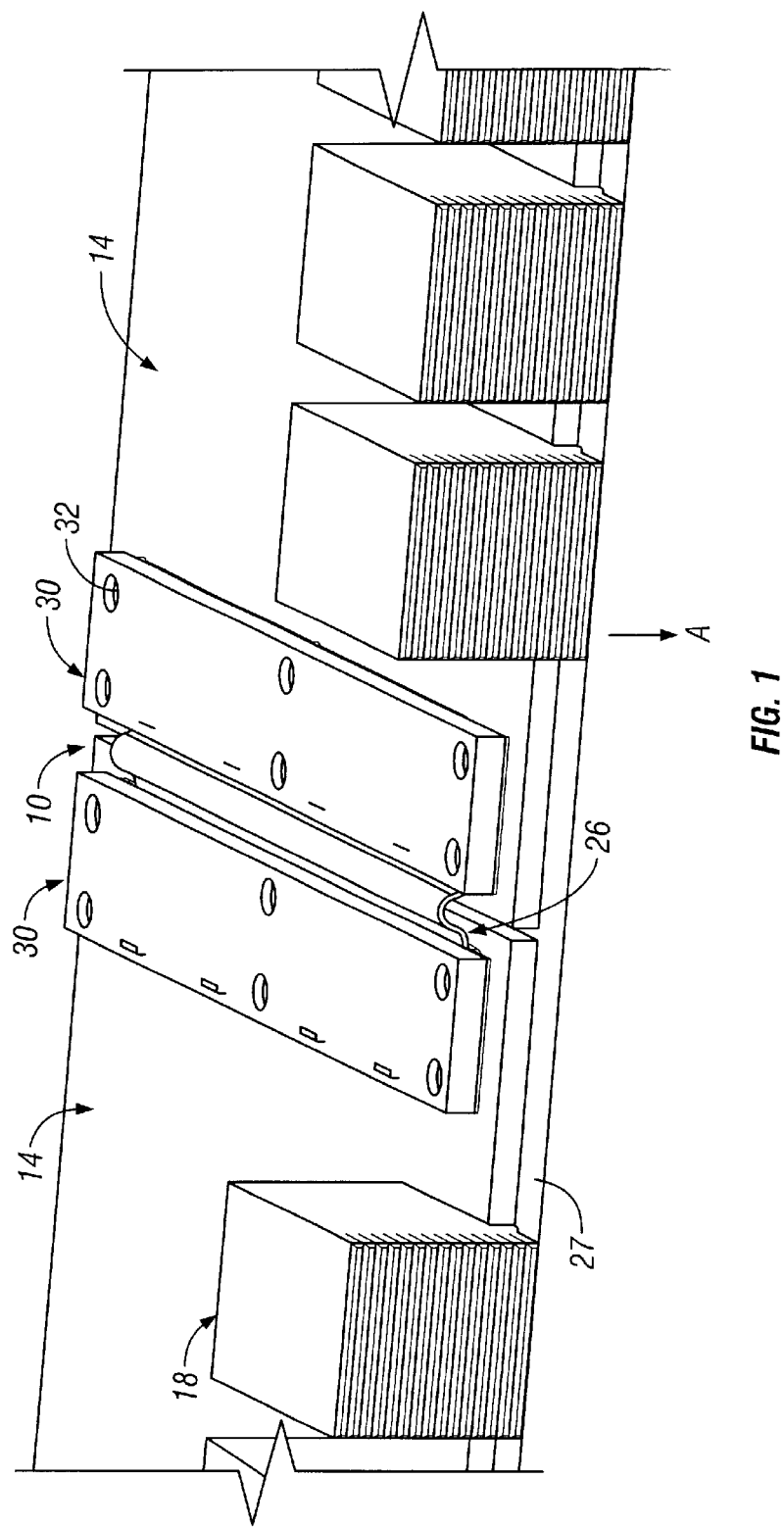
FIG. 1 illustrates a top isometric view of a top connector assembly and adjacent printed circuit boards formed in accordance with an embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

FIG. 1 illustrates a top isometric view of a top connector assembly 10 and adjacent printed circuit boards 14 formed in accordance with an embodiment of the present invention. The printed circuit boards 14 are retained in a desired lateral position relative to one another in a box-shaped chassis (not shown). A thin flex circuit 26 is electrically connected to each printed circuit board 14 proximate adjoining edges 62 and extends therebetween. The flex circuit 26 is retained tightly against each printed circuit board 14 by thin rectangular load cells 30 connected to the printed circuit board 14 and flex circuit 26 by screws 32. The load cell 30 applies a predetermined load force downward in the direction of arrow A against the flex circuit 26 and the printed circuit boards 14 to maintain the flex circuit 26 in electrical communication with the printed circuit boards 14.

Figure 2:
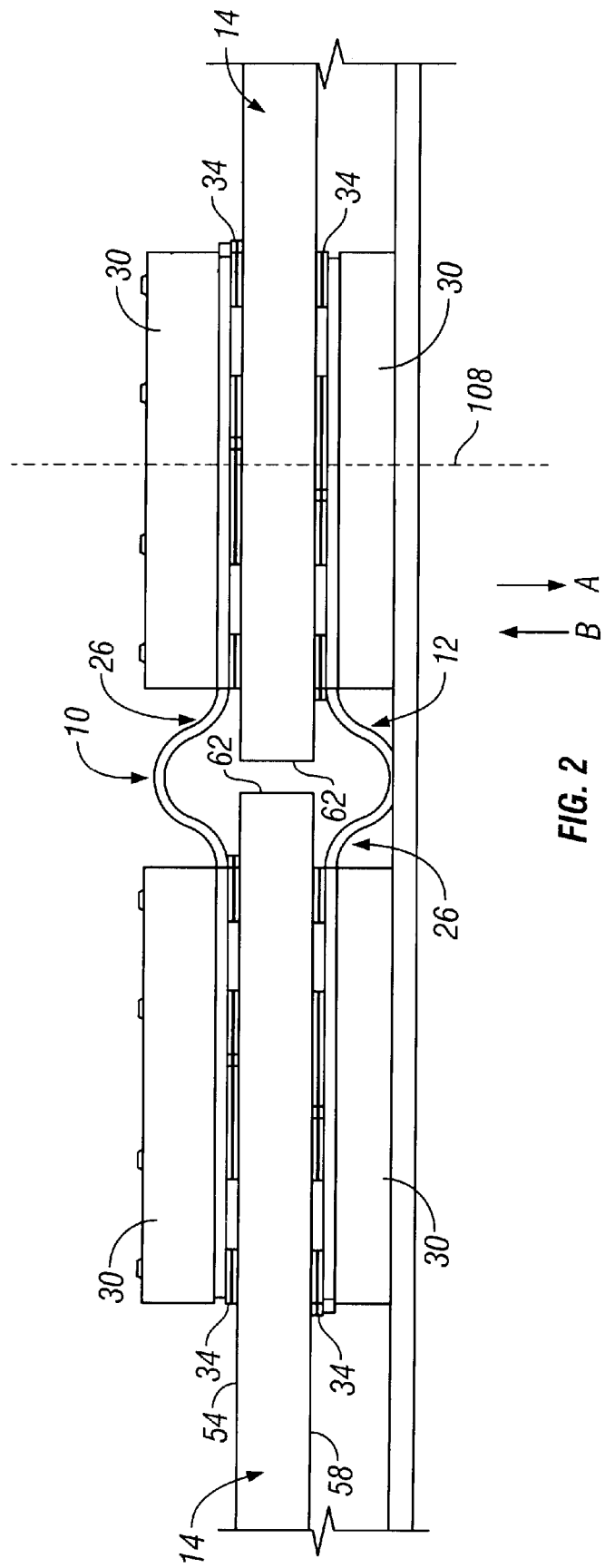
FIG. 2 illustrates a side view of the top connector assembly and a bottom connector assembly with the printed circuit boards positioned therebetween formed in accordance with an embodiment of the present invention.

FIG. 2 illustrates a side view of the top connector assembly 10 and a bottom connector assembly 12 with the printed circuit boards 14 positioned therebetween in accordance with an embodiment of the present invention. The printed circuit boards 14 include top and bottom sides 54 and 58. The bottom connector assembly 12 extends between and underneath the printed circuit boards 14 with load cells 30 pushing upward in the direction of arrow B against a flex circuit 26 and the printed circuit boards 14. The top and bottom connector assemblies 10 and 12 include thin rectangular socket connectors 34 situated on the top and bottom sides 54 and 58 of the printed circuit boards 14 proximate the adjoining edges 62. The socket connectors 34 are covered by, and electrically connected to, the flex circuits 26. In operation, electrical signals pass between the socket connectors 34 and the printed circuit boards 14 through the oppositely oriented flex circuits 26 of the top and bottom connector assemblies 10 and 12.

The load cells 30 of the top and bottom connector assemblies 10 and 12 are oppositely aligned and are interconnected by the screws 32 (FIG. 1). The oppositely aligned load cells 30 apply a predetermined load force against each other to maintain the flex circuits 26, socket connectors 34, and printed circuit boards 14 tightly pressed together and thus electrically connected. The load cells 30 of the top and bottom connector assemblies 10 and 12 also resist each other, therefore, the printed circuit boards 14 are not bent or damaged by the load forces applied by any one load cell 30. Additionally, the socket connectors 34, load cells 30, and flex circuits 26 have low profiles along a vertical axis 108, so the top and bottom connector assemblies 10 and 12 take up very little additional space beyond the envelope (e.g., above and below) of the printed circuit boards 14. Thus, the printed circuit boards 14 may be used in electronic components where space is limited.

Figure 8:
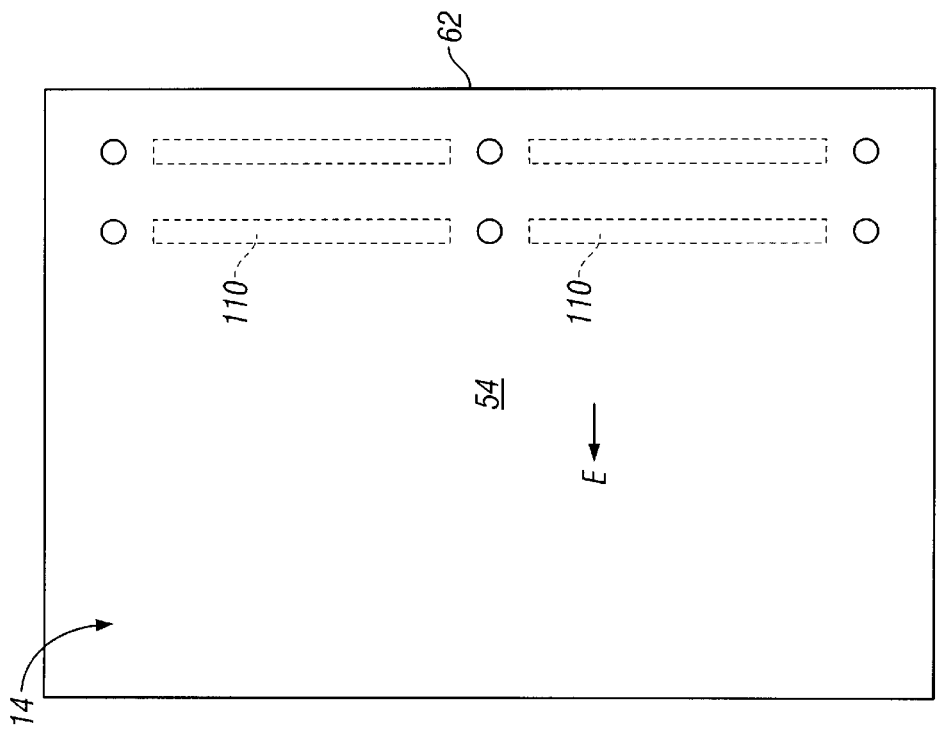
FIG. 8 illustrates a top view of a printed circuit board formed in accordance with an embodiment of the present invention.

As shown in FIG. 8, the printed circuit boards 14 include thin platings or land grid arrays (LGAs) 110 on each top side 54 and bottom side 58 (FIG. 2) proximate the adjoining edges 62 (FIG. 2). The LGAs 110 contain electrical contacts (not shown). The LGAs 110 are not aligned directly opposite each other on the top and bottom sides 54 and 58, rather, because of the high concentration of electrical traces-within the printed circuit boards 14 proximate the LGAs 110, the LGAs 110 are laterally offset in the direction of arrow E (FIG. from each other along the top and bottom sides 54 and 58. For example, the LGAs 110 on the top sides 54 may be located proximate the edges 62, while the LGAs 110 on the bottom sides 58 may be located a distance from the edges 62 so as to not be directly aligned under the LGAs 110 on the top sides 54.

Figure 4:
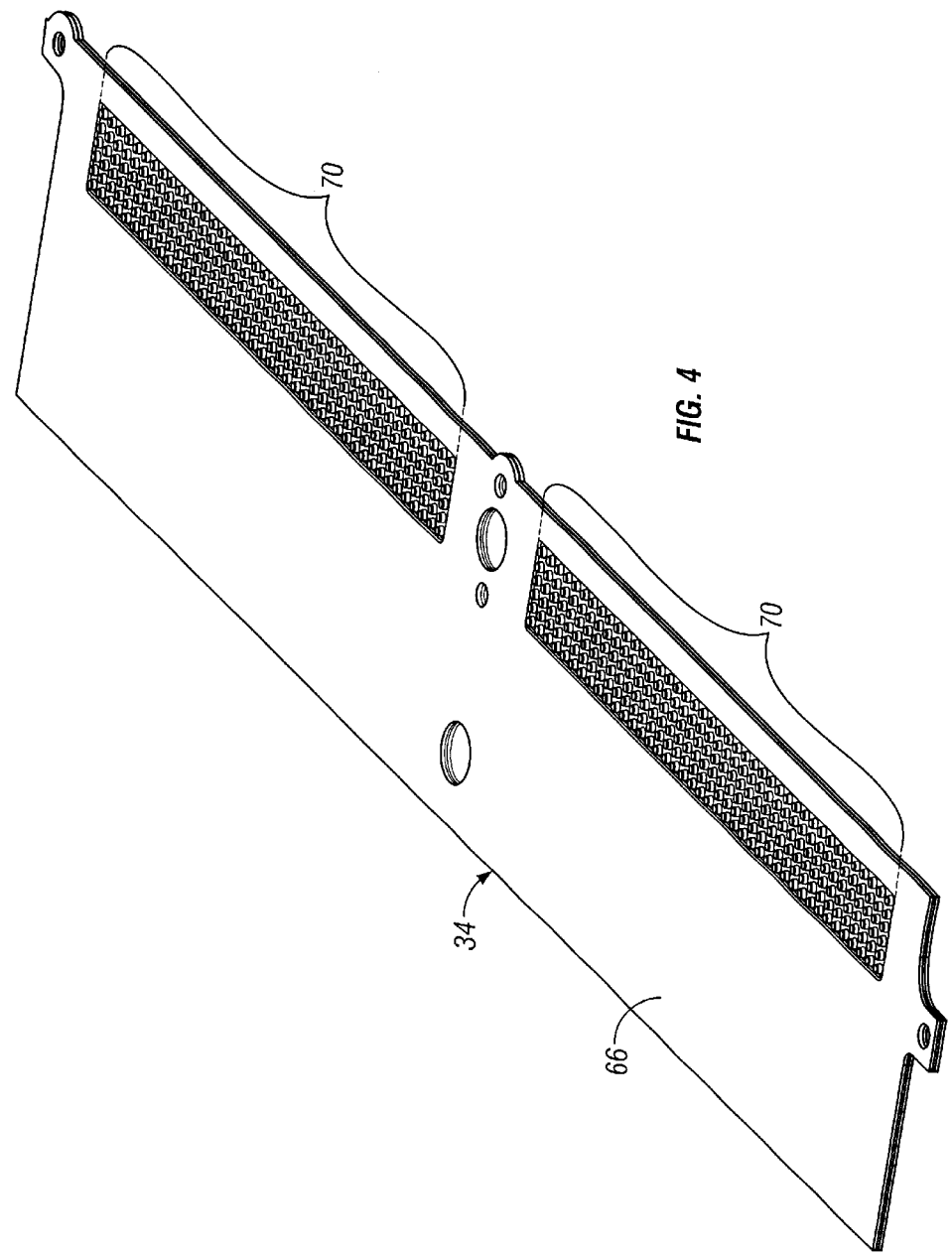
FIG. 4 illustrates a top isometric view of a socket connector in more detail.

FIG. 4 illustrates a socket connector 34 in more detail. The socket connector 34 is a thin, flexible wafer with an insulating portion 66 provided on opposite sides that surrounds a large number of conductive contacts 70 that extend through the socket connector 34.

Figure 3:
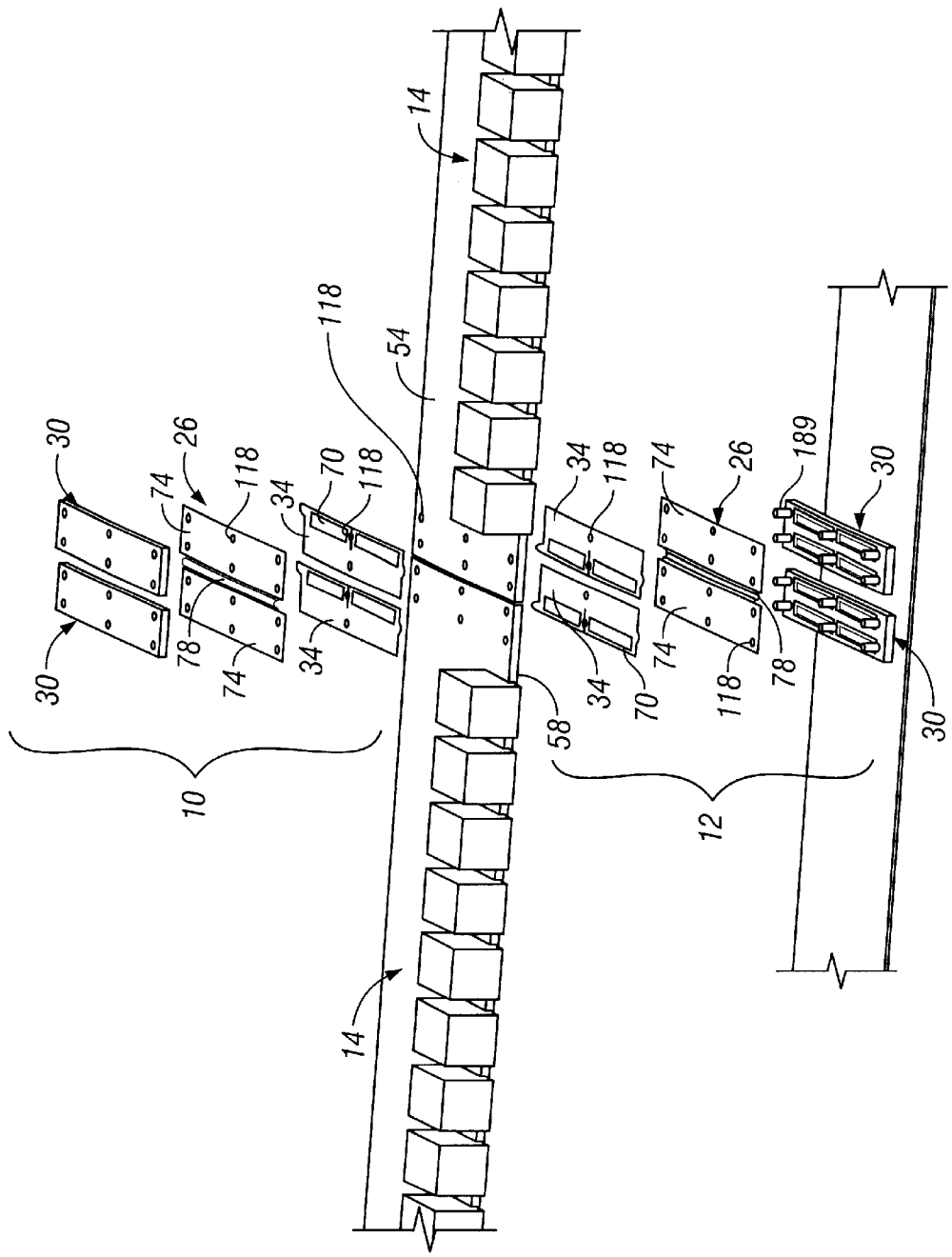
FIG. 3 illustrates an exploded isometric view of the top and bottom connector assemblies and printed circuit boards of FIG. 2.

FIG. 3 illustrates an exploded isometric view of the top and bottom connector assemblies 10 and 12 and printed circuit boards 14. Each top and bottom connector assembly 10 and 12 includes load cells 30, flex circuits 26, and socket connectors 34 stacked on one another in a symmetric manner. The flex circuits 26 include two thin wafers 74 connected to each other by arched flex circuit portions 78. The wafers 74 include conductive contacts (not shown) situated in arrays that are aligned with the conductive contacts 70 on the socket connectors 34. The wafers 74 also include conductive layers (not shown) containing traces. The traces extend between the wafers 74 across the arched flex circuit portions 78, connecting corresponding conductive contacts on the wafers 74.

The socket connectors 34 are positioned on the top and bottom sides 54 and 58 of the printed circuit boards 14 such that the conductive contacts 70 are aligned, and electrically communicate with, the electrical contacts within the LGAs 110. Thus, electrical signals are sent from the printed circuit boards 14 through the electrical contacts within the LGAs 110 to the conductive contacts 70 within the socket connectors 34. Because the socket connectors 34 are thin, electrical signals traveling therethrough experience little inductance and thus travel at a high frequency. Additionally, because the socket connectors 34 are thin and flexible, little load force is required to maintain an electrical connection with the electrical contacts in the LGAs. When the flex circuits 26 are positioned on the socket connectors 34, the conductive contacts of the wafers 74 electrically communicate with the conductive contacts 70 of the socket connectors 34 such that electrical signals are sent between the socket connectors 34 (and thus the printed circuit boards 14) through the traces.

Figure 5:
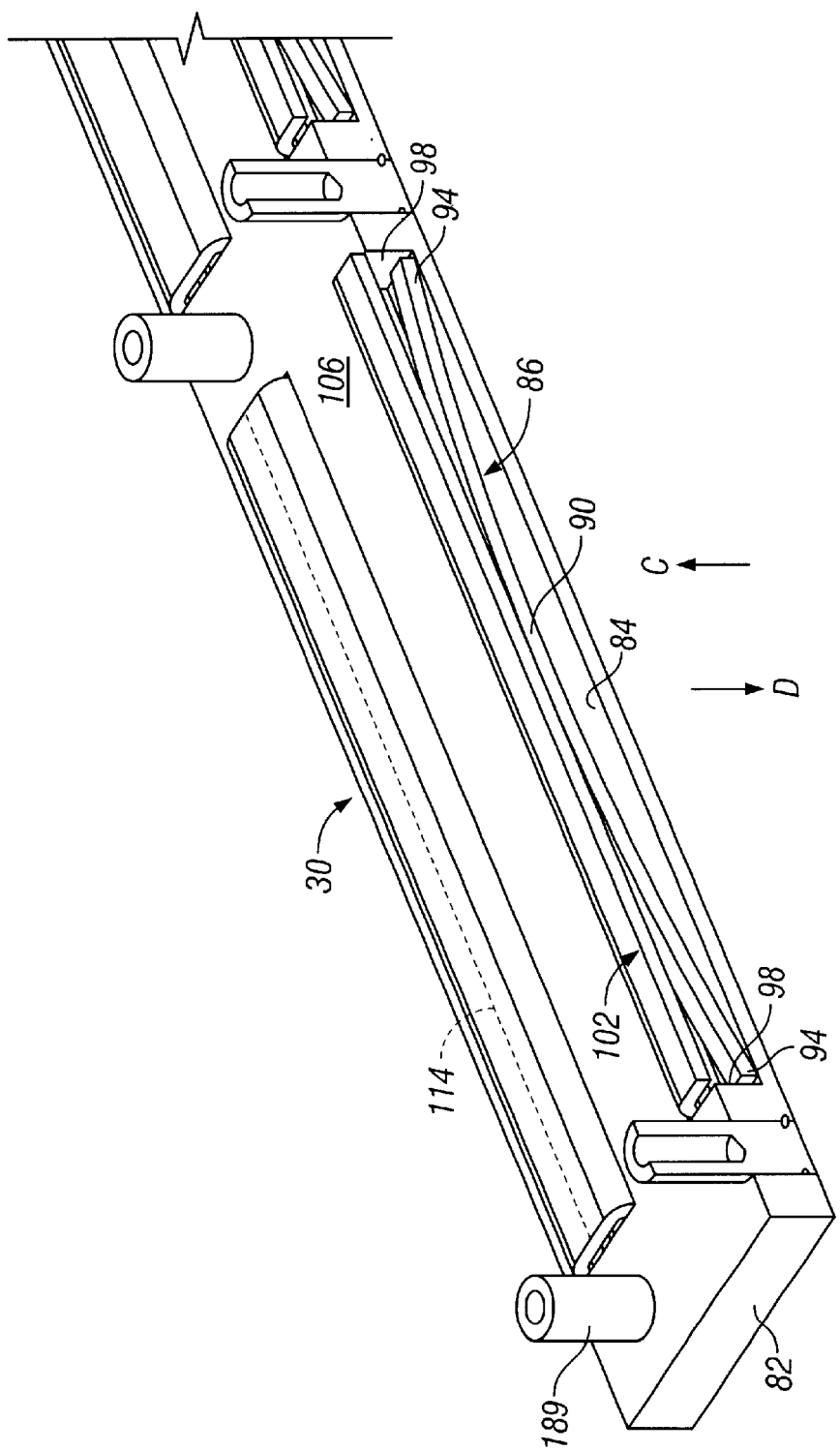
FIG. 5 illustrates a sectional isometric view of a load cell formed in accordance with an embodiment of the present invention.

FIG. 5 illustrates a sectional isometric view of a load cell 30 formed in accordance with an embodiment of the present invention. The load cell 30 includes a housing or base plate 82 having a contact face 106 with recesses 84 therein for receiving and holding flex beams or bowed springs 86. Each bowed spring 86 has a peak portion 90 and opposite end portions 94. The bowed springs 86 are preloaded within the base plate 82 by positioning the end portions 94 between ledges 98 at opposite ends of the recesses 84. The bowed springs 86 are received in the recesses 84 extending along a longitudinal axis 114 arranged parallel to the contact face 106 and being curved within a plant extending perpendicular to the contact face 106.

The bowed springs 86 are further retained within the base plate 82 by rectangular pressure plates or cover plates 102. The cover plates 102 are held within the recesses 84 by peripheral tabs (not shown) that are retained by catches (not shown) in the base plate 82 along the recesses 84. The cover plates 102 engage the bowed springs 86 such that the bowed springs 86 are compressed between the cover plates 102 and the base plate 82. The cover plates 102 press downward on the peak portions 90 in the direction of arrow D forcing the end portions 94 to extend outward longitudinally away from each other. The bowed springs 86 thus exert a resisting force load upward in the direction of arrow C along the peak portions 90 at the centers of the cover plates 102. Because the load cell 30 includes several bowed springs 86, each of which exert a load force in the direction of arrow C against cover plates 102, the load forces are evenly distributed across the contact face 106 of the load cell 30.

The load cell 30 includes threaded standoffs 189 that receive the screws 32 (FIG. 1) that connect oppositely aligned load cells 30 to each other.

Returning to FIG. 3, the load cells 30 are oriented within the top and bottom connector assemblies 10 and 12 such that the threaded standoffs 189 are aligned to extend through apertures 118 in the flex circuit 26 and the socket connectors 34 into the printed circuit boards 14, and the cover plates 82 (FIG. 5) are aligned to abut against the wafers 74 of the flex circuits 26. The load cells 30 are then screwed into the printed circuit boards 14 with each load cell 30 firmly pressing against a wafer 74.

Returning to FIG. 2, the load cells 30 of the fully assembled top connector assembly 10 exert a load force downward in the direction of arrow A through the cover plates 82 (FIG. 5) against the flex circuit 26, socket connectors 34, and printed circuit boards 14 such that the printed circuit board 14, socket connectors 34, and flex circuits 26 are held within electrical contact with reduced interference and resistance. Likewise, the load cells 30 of the fully assembled bottom connector assembly 10 exert a load force upward in the direction of arrow B through the cover plates 82 against the flex circuit 26, socket connectors 34, and printed circuit boards 14 such that the printed circuit board 14, socket connectors 34, and flex circuits 26 are held within electrical contact with reduced interference and resistance. The oppositely oriented top and bottom connector assemblies 10 and 12 absorb and resist opposed load forces in order to prevent the printed circuit boards 14 from being bent in the direction of arrow A or arrow B. The flex circuits 26 of the top and bottom connector assemblies 10 and 12 are the same size, so the electrical signals conveyed through the flex circuits 26 travel the same distance and experience the same inductance and thus travel at the same frequency.

Figure 9:
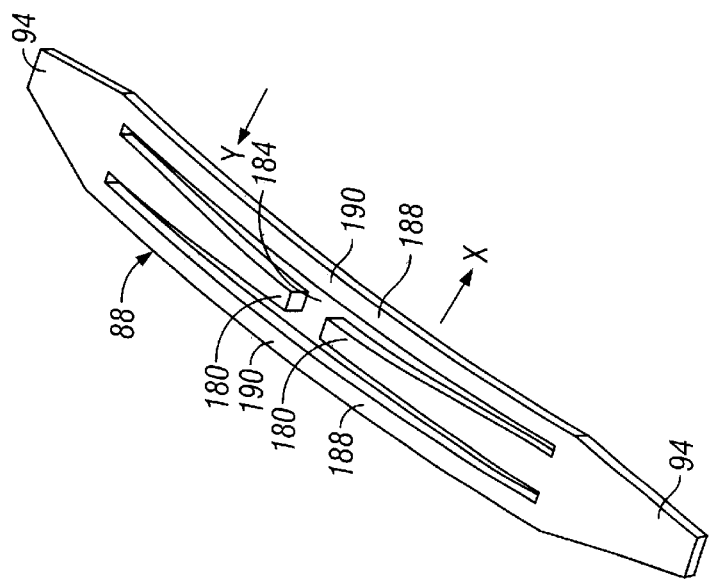
FIG. 9 illustrates an isometric top view of a bowed spring formed in accordance with an embodiment of the present invention.

FIG. 9 illustrates an isometric top view of a bowed spring 88 formed in accordance with an alternative embodiment of the present invention. The bowed spring 88 includes bifurcated prongs 180 extending inward toward each other from the end portions 94. Curved strips 188 having peak portions 90 extend between the end portions 94 and are separated by a gap 184.

Figure 10:
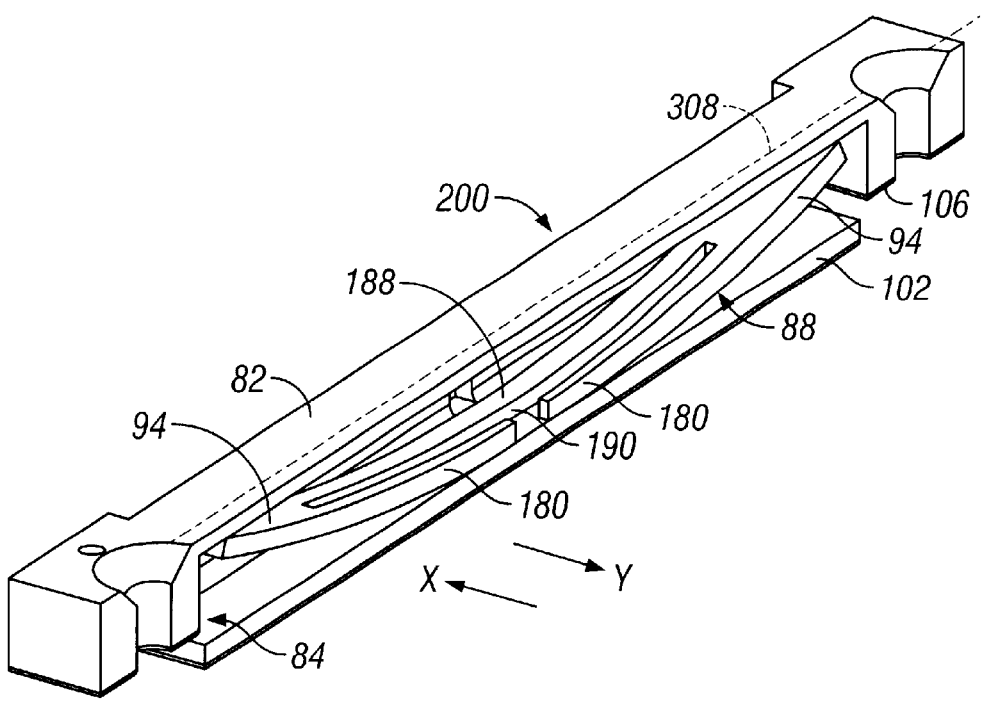
FIG. 10 illustrates a sectional isometric view of a load cell formed in accordance with an embodiment of the present invention.

FIG. 10 illustrates a sectional isometric view of a load cell 200 having the bowed spring 88 of FIG. 9. The bowed spring 88 is received in the recess 84 extending along a longitudinal axis 308 arranged parallel to the contact face 106 and in a plane extending perpendicular to the contact face 106. In operation, the bowed spring 88 is compressed between the cover plate 102 and the base plate 82 such that the peak portions 90 and bifurcated prongs 180 are pressed in the direction of arrow X by the cover plate 102 and the end portions 94 are resisted by the base plate 82 in the direction of arrow Y. The gap 184 allows the bifurcated prongs 180 to be pressed into the base plate 82 as the strips remain in contact with the cover plate 102. Thus, the bifurcated prongs 180 apply a load force directly to the center of the base plate 82 such that the load force of the load cell 200 may be evenly distributed about the flex circuits 26 (FIG. 3).

Figure 6:
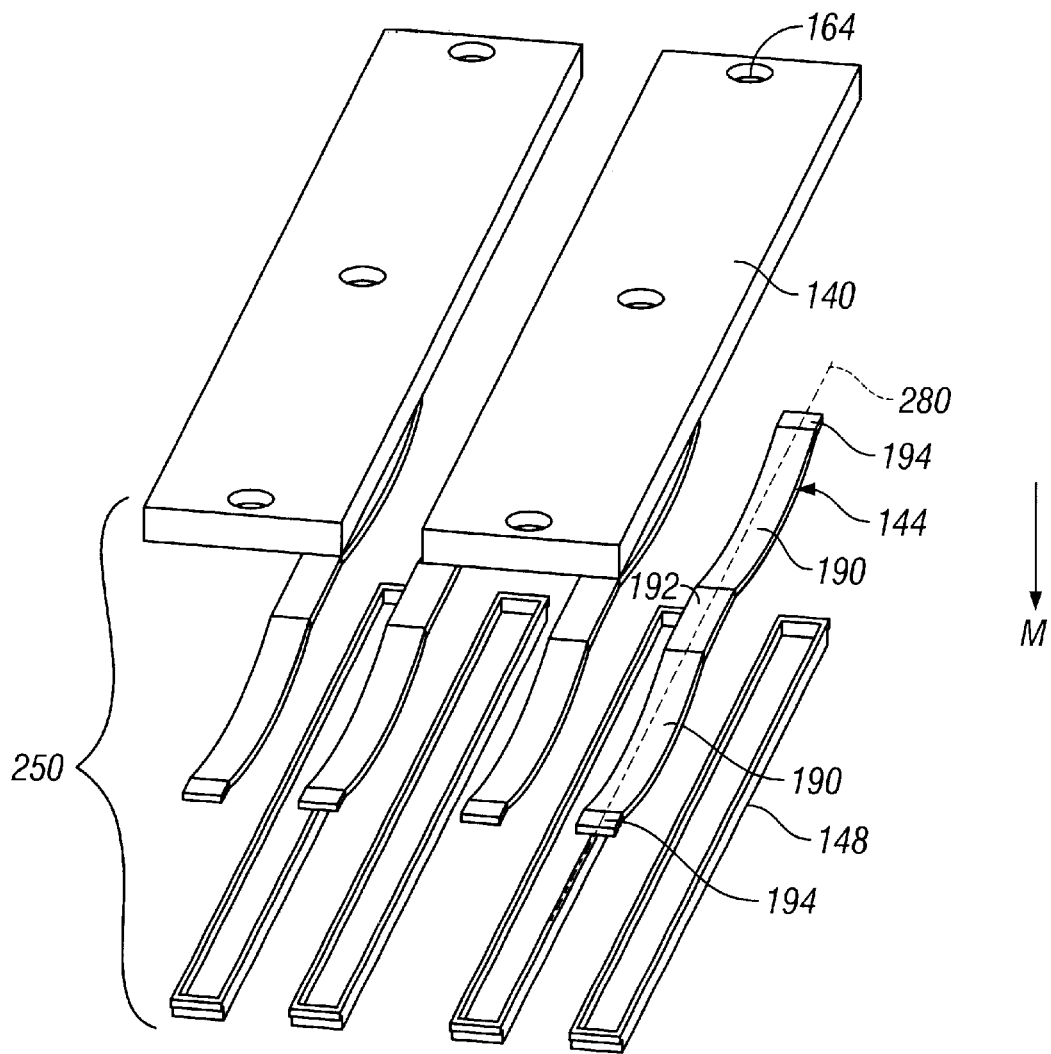
FIG. 6 illustrates an exploded isometric view of a load cell formed in accordance with an alternative embodiment of the present invention.

FIG. 6 illustrates an exploded isometric view of load cells 250 formed in accordance with an alternative embodiment of the present invention. The load cell 250 may be used with the top and bottom connector assemblies 10 and 12 of FIG. 2 or any number of other connector assembly alignments. Cover plates 148 receive and hold double-bowed springs 144. Each spring 144 has two peak portions 190, end portions 194, and a foot portion 192 and is covered within the cover plate 148 by a base plate 140. Each spring 144 extends along a longitudinal axis 280 arranged parallel to the base plate 140 and is bowed within a plane extending perpendicular to the base plate 140 such that the peak portions 190 are proximate the cover plate 148 and the end portions 194 are remote from the cover plate 148. The screws 32 (FIG. 1) are inserted into apertures 164 in the base plate 140 to secure the load cell 250 to the printed circuit boards 14 (FIG. 3) with the socket connector 34 (FIG. 3) and wafer 74 (FIG. 3) retained therebetween. As the load cell 250 is screwed into an oppositely aligned load cell 250, the base plates 140 push the foot portions 192 in the direction of arrow M, compressing the springs 144 such that the peak portions 190 deliver load forces into the cover plate 148 in the direction of arrow M. The load cell 250 applies a load force through the cover plates 148 that presses the wafer 74 and the socket connector 34 firmly against the printed circuit boards 14 and thus maintains an electrical connection therethrough.

Figure 7:
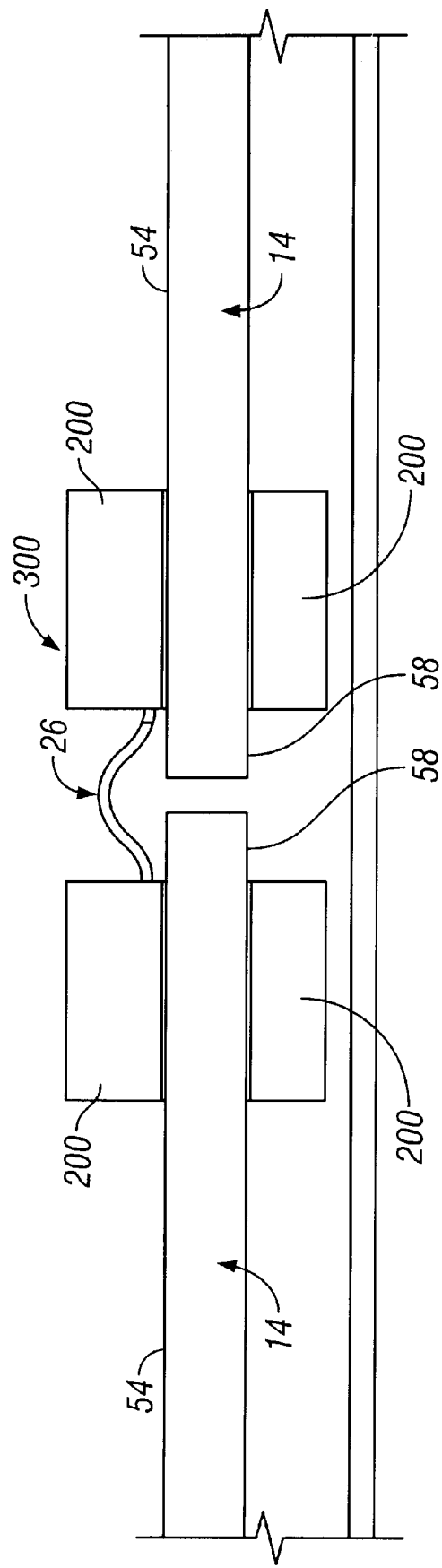
FIG. 7 illustrates a side view of a top connector assembly formed in accordance with an alternative embodiment of present invention.

Because the load cells 30, 200, and 250 have a low profile, the load cells 30, 200, and 250 may be used in a number of different connector assemblies. For example, FIG. 7 illustrates a side view of a top connector assembly 10 where the load cells 200 are aligned opposite each other to retain a single flex circuit 26 on the top sides 54 of the printed circuit boards 14. The load cells 200 may also be connected to bolster plates in an alternative embodiment.

In another embodiment, the load cells 30, 200, and 250 retain overlapping flex circuits 26 on both the top and bottom sides 54 and 58 of the printed circuit boards 14 such that each flex circuit 26 is opposite another flex circuit 26. Again, the load cells 30, 200, and 250 may be connected to corresponding load cells or to bolster plates.

The connector assemblies of the described embodiments confer several benefits. First, the bowed springs have a low profile along the vertical axis and apply a large load force. Thus the load cells electrically connect the conductive contacts of a flex circuit having any number of conductive layers to the conductive contacts of a socket connector such that the connector assembly conveys a large number of electrical signals at a high speed while taking up little space. Further, the load cells are aligned opposite, and are connected to, each other rather than bolster plates, so the connector assemblies have a low profile along the vertical axis and are used in a number of different applications where space is limited.

Also, by aligning the top and bottom connector assemblies opposite each other, electrical signals conveyed through the opposite flex circuits travel the same distances and experience the same amount of inductance. The use of two oppositely aligned flex circuits also allows for the electrical signals to be processed at a higher speed and at a greater volume. Further, aligning the load cells of the top and bottom connector assemblies opposite each other prevents the printed circuit boards from being bent by the load forces generated by any of the load cells.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An electrical connector assembly comprising:
    first and second circuit boards configured to be positioned proximate each other and having electrical contacts on top and bottom sides thereof;
    socket connectors having conductive contacts positioned upon said top and bottom sides of said circuit boards such that said conductive contacts and said electrical contacts are electrically connected with one another,
    first and second flex circuits having conductive contacts, said first flex circuit interconnecting said electrical contacts on said top sides of said first and second circuit boards, said second flex circuit interconnecting electrical contacts on said bottom sides of said first and second circuit boards such that said first and second flex circuits are located opposite each other; and
    at least one load cell configured to exert a load force against at least one of said first and second flex circuits to compress said first and second flex circuits and said socket connectors against said first and second circuit boards.

2. The electrical connector assembly of claim 1, wherein said load cells on said first flex circuits on said top sides are opposite said load cells on said second flex circuits on said bottom sides, said load cells on said top sides being connected to said load cells on said bottom sides by screws, said screws holding said load cells against said first and second flex circuits.

3. The electrical connector assembly of claim 1, wherein said electrical contacts of said first and second circuit boards are aligned in land grid arrays in order that said electrical contacts electrically engage said conductive contacts of said socket connectors.

4. The electrical connector assembly of claim 1, wherein said load cell has at least one spring retained in a recess in a base plate, said spring being compressed between said base plate and a cover plate with said base plate resistibly engaging end portions of said spring such that a peak portion of said spring delivers said load force against said cover plate.

5. The electrical connector assembly of claim 1, wherein said load cell includes at least one spring having arch shaped strips separated by a gap extending between end portions and bifurcated prongs extending inward from said end portions such that when said spring is compressed between a base plate and a cover plate, said bifurcated prongs are pressed toward said base plate and said strips press against said cover plate.

6. The electrical connector assembly of claim 1, wherein load cell includes a base plate retaining a plurality of springs in recesses, said springs resistibly engaging cover plates, said load cell being positioned upon said first and second flex circuits such that said cover plates uniformly apply said load force against said first and second flex circuits.

7. The electrical connector assembly of claim 1, wherein said load cell includes at least one spring having two peak portions with end portions connected at a foot, said spring being compressed between a cover plate and a base plate such that said peak portions deliver said load force through said cover plate as said end portions and foot are resisted by said base plate.

8. An electrical connector assembly comprising:
    first and second circuit boards proximate each other, said first and second circuit boards each having a first side and a second side,
    a flex circuit electrically connected to said first sides of said first and second circuit boards and carrying electrical signals therebetween; and
    at least one load cell having at least one bowed spring, a base plate, and a cover plate, said spring having a peak portion and end portions and being compressed between said base plate and said cover plate, said peak portion engaging one of said base plate and said cover plate, said end portions engaging another of said base plate and said cover plate to exert a load force on said base plate and said cover plate.

9. The electrical connector assembly of claim 8, further comprising a socket connector electrically interconnected between said flex circuit and said first and second circuit boards, said socket connector, flex circuit, and said first and second circuit boards all having electrical contacts aligned to convey said electrical signals.

10. The electrical connector assembly of claim 8, further comprising an additional flex circuit retained by said load cell on said second sides of said first and second circuit boards opposite said flex circuit on said first sides of said first and second circuit boards, said load cells retaining said flex circuit and said additional flex circuit opposite each other.

11. The electrical connector assembly of claim 8, wherein said load cells are positioned on said first and second sides of said printed circuit boards opposite each other.

12. The electrical connector assembly of claim 8, wherein said spring of said load cell is retained in a recess in said base plate, said spring being compressed between said base plate and said cover plate with said base plate resistibly engaging said end portions such that said peak portion delivers said load force against said cover plate.

13. The electrical connector assembly of claim 8, wherein said spring of said load cell has arch shaped strips separated by a gap extending between said end portions and bifurcated prongs extending inward from said end portions such that when said spring is compressed between said base plate and said cover plate, said bifurcated prongs are pressed toward said base plate and said strips press against said cover plate.

14. The electrical connector assembly of claim 8, wherein said spring has two peak portions with end portions connected at a foot, said spring being compressed between said cover plate and said base plate such that said peak portions deliver said load force through said base plate as said end portions and foot are resisted by said cover plate.

15. An electrical connector assembly comprising:
first and second circuit boards proximate each other, said first and second circuit boards each having a first side and a second side,
a flex circuit electrically connected to said first sides of said first and second circuit boards and carrying electrical signals therebetween; and
load cells having at least one bowed spring, a base plate, and a cover plate, said spring having a peak portion and end portions and being compressed between said base plate and said cover plate, said peak portion engaging one of said base plate and said cover plate, said end portions engaging another of said base plate and said cover plate to exert a load force on said base plate and said cover plate, said load cells being located on said first and second circuit boards opposite each other on said first and second sides.

16. The electrical connector assembly of claim 15, further comprising a socket connector electrically interconnected between said flex circuit and said first and second circuit boards, said socket connector, flex circuit, and said first and second circuit boards all having electrical contacts aligned to convey said electrical signals.

17. The electrical connector assembly of claim 15, further comprising an additional flex circuit retained by said load cells on said second sides of said first and second circuit boards opposite said flex circuit on said first sides of said first and second circuit boards.

18. The electrical connector assembly of claim 15, wherein said spring is retained in a recess in said base plate, said spring being compressed between said base plate and said cover plate with said base plate resistibly engaging said end portions such that said peak portion delivers said load force against said cover plate.

19. The electrical connector assembly of claim 15, wherein said spring has arch shaped strips separated by a gap extending between said end portions and bifurcated prongs extending inward from said end portions such that when said spring is compressed between said base plate and said cover plate, said bifurcated prongs are pressed toward said base plate and said strips press against said cover plate.

20. The electrical connector assembly of claim 15, wherein said spring has two peak portions with end portions connected at a foot, said spring being compressed between said cover plate and said base plate such that said peak portions deliver said load force through said base plate as said end portions and foot are resisted by said cover plate.

21. A load cell comprising:
a base adapted to be mounted to a flex circuit having a notched recess located in a contact face of said base,
a cover received in said notched recess to define a spring retention chamber extending along a lateral axis arranged parallel to said contact face; and
a flex beam located in said spring retention chamber, said flex beam being bowed with opposed end portions engaging one of said base and cover, said flex beam including an intermediate portion between said opposed end portions engaging another of said base and cover, said flex beam being compressed between said base and cover to exert a load force on said base and cover.

22. The load cell of claim 21, wherein said intermediate portion of said flex beam includes at least one peak portion engaging one of said base and cover.

23. The load cell of claim 21, wherein said flex beam being bowed within a plane extending perpendicular to said contact face such that said intermediate portion is proximate said contact face and said end portions are remote from said contact face.

24. The electrical connector assembly of claim 21, wherein said flex beam has arch shaped strips separated by a gap extending between said end portions and bifurcated prongs extending inward from said end portions such that when said flex beam is compressed between said base and said cover, said bifurcated prongs are pressed toward one of said base and cover and said strips deliver said load force against another of said base and cover.

25. The electrical connector assembly of claim 21, wherein said spring has two peak portions with end portions connected at a foot and is compressed between said cover and said base such that said peak portions deliver said load force through to one of said base and cover as said end portions and foot are resisted by another of said base and cover.

* * * * *